(12) United States Patent
Guo et al.

(10) Patent No.: US 10,170,368 B2
(45) Date of Patent: Jan. 1, 2019

(54) FABRICATING FIN-BASED SPLIT-GATE HIGH-DRAIN-VOLTAGE TRANSISTOR BY WORK FUNCTION TUNING

(71) Applicant: INTERNATIONAL BUSINESS MACHINES CORPORATION, Armonk, NY (US)

(72) Inventors: Dechao Guo, Niskayuna, NY (US); Liyang Song, Mount Kisco, NY (US); Xinhui Wang, Poughkeepsie, NY (US); Qintao Zhang, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/801,998

(22) Filed: Nov. 2, 2017

(65) Prior Publication Data

US 2018/0286761 A1 Oct. 4, 2018

Related U.S. Application Data

(63) Continuation of application No. 15/477,575, filed on Apr. 3, 2017.

(51) Int. Cl.
*H01L 21/8234* (2006.01)
*H01L 21/84* (2006.01)
(Continued)

(52) U.S. Cl.
CPC ........ *H01L 21/823431* (2013.01); *H01L 21/82385* (2013.01); *H01L 21/823456* (2013.01);
(Continued)

(58) Field of Classification Search
CPC .......... H01L 21/823431; H01L 21/823842
See application file for complete search history.

(56) References Cited

U.S. PATENT DOCUMENTS

| 5,063,172 A | 11/1991 | Manley |
| 6,563,151 B1 | 5/2003 | Shin et al. |
(Continued)

OTHER PUBLICATIONS

List of IBM Patents or Patent Applications Treated as Related dated Nov. 2, 2017, 2 pages.
(Continued)

*Primary Examiner* — Lex Malsawma
*Assistant Examiner* — Xia Cross
(74) *Attorney, Agent, or Firm* — Tutunjian & Bitetto, P.C.; Vazken Alexanian

(57) ABSTRACT

A method is presented for creating an asymmetrical split-gate structure. The method includes forming a first device, forming a second device, forming a first gate stack between a first set of spacers of the first device, and a second gate stack between a second set of spacers of the second device. The method further includes depositing a hard mask over the first and second gate stacks, etching a first section of the first gate stack to create a first gap and a second section of the second gate stack to create a second gap, and forming a third gate stack within the first gap of the first gate stack and within the second gap of the second gate stack such that dual gate stacks are defined for each of the first and second devices. The method further includes annealing the dual gate stacks to form replacement metal gate stacks.

10 Claims, 6 Drawing Sheets

(51) Int. Cl.
  *H01L 27/12* (2006.01)
  *H01L 27/088* (2006.01)
  *H01L 27/092* (2006.01)
  *H01L 21/8238* (2006.01)
  *H01L 29/49* (2006.01)
  *H01L 29/423* (2006.01)
  *H01L 29/78* (2006.01)

(52) U.S. Cl.
  CPC ............... *H01L 21/823821* (2013.01); *H01L 21/823842* (2013.01); *H01L 21/845* (2013.01); *H01L 27/0886* (2013.01); *H01L 27/0924* (2013.01); *H01L 27/1211* (2013.01); *H01L 29/42376* (2013.01); *H01L 29/4983* (2013.01); *H01L 29/7856* (2013.01)

(56) References Cited

U.S. PATENT DOCUMENTS

| | | |
|---|---|---|
| 6,664,153 B2 | 12/2003 | Ang et al. |
| 6,888,199 B2 | 5/2005 | Nowak et al. |
| 7,285,829 B2 | 10/2007 | Doyle et al. |
| 8,003,463 B2 | 8/2011 | Anderson et al. |
| 9,202,762 B2 | 12/2015 | Xiao et al. |
| 2008/0308870 A1 | 12/2008 | Faul et al. |
| 2009/0108351 A1 | 4/2009 | Yang et al. |
| 2012/0032732 A1 | 2/2012 | Xiao et al. |
| 2012/0049297 A1* | 3/2012 | Takeoka ............ H01L 21/02181 257/410 |
| 2012/0112256 A1 | 5/2012 | Tan et al. |
| 2013/0171793 A1* | 7/2013 | Heo ................. H01L 21/823418 438/294 |
| 2013/0270647 A1* | 10/2013 | Zhu ....................... H01L 21/022 257/369 |
| 2015/0228787 A1* | 8/2015 | Goto .................... H01L 29/4966 257/412 |

OTHER PUBLICATIONS

Xu et al., "A Technique to Improve the Drive Current of High-Voltage I/O Transistors in Digital CMOS Technologies", IEEE Electron Device Letters. vol. 26, Issue 10. Sep. 19, 2005. pp. 752-754.

* cited by examiner

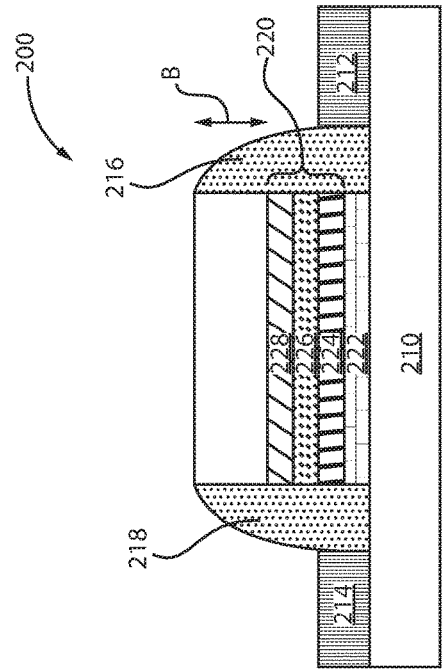
FIG. 1
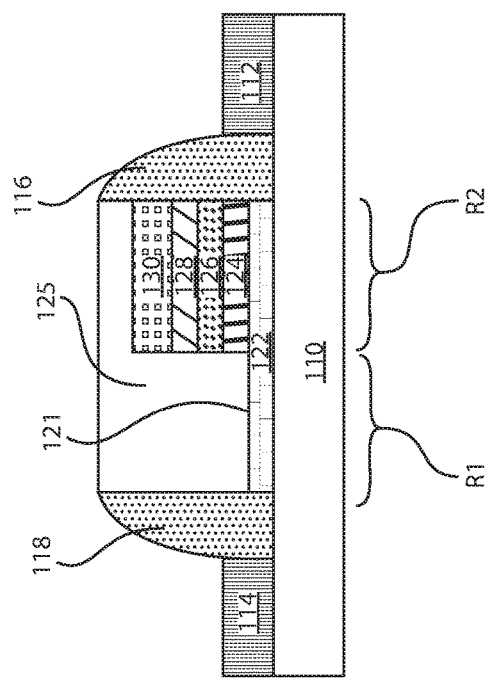
FIG. 2
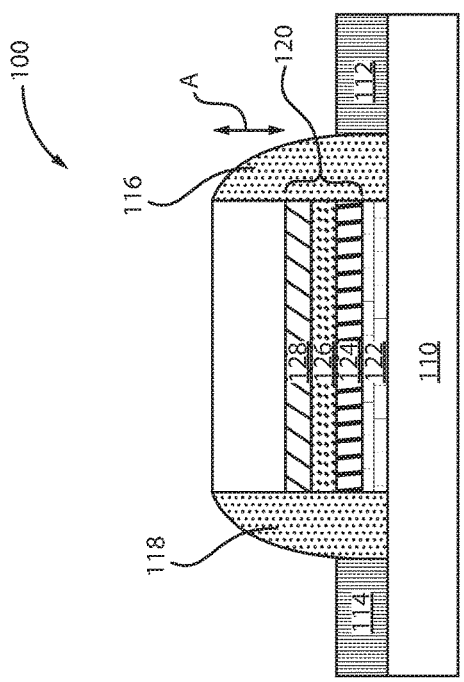

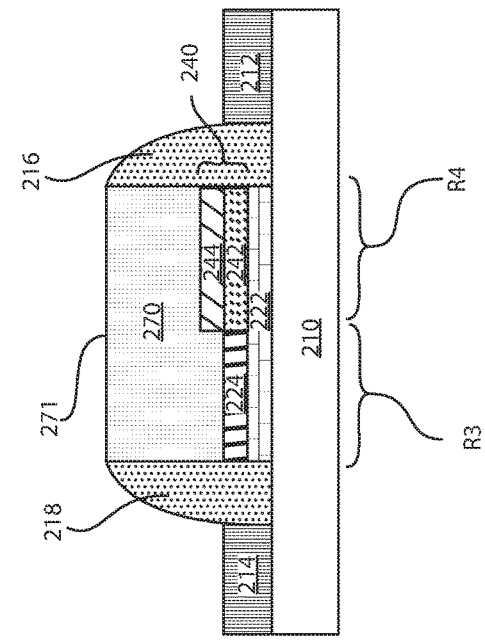
FIG. 6
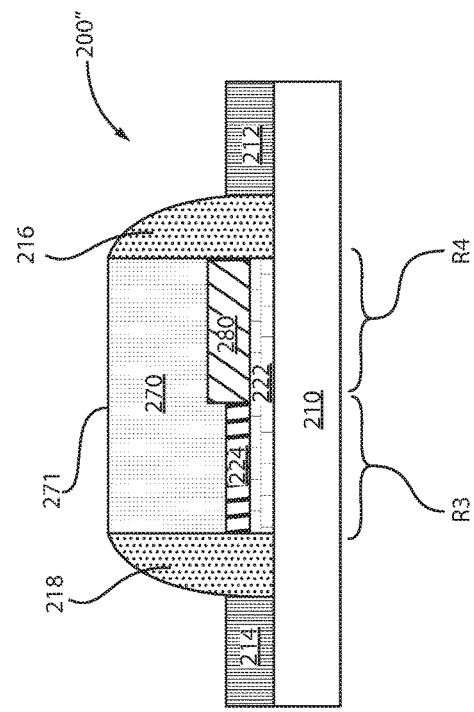
FIG. 7
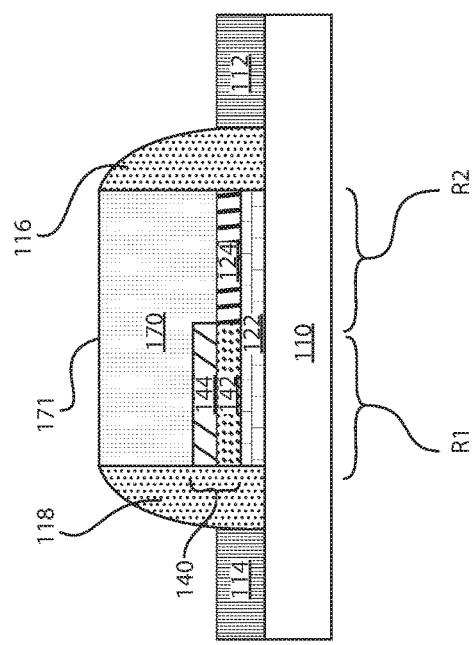
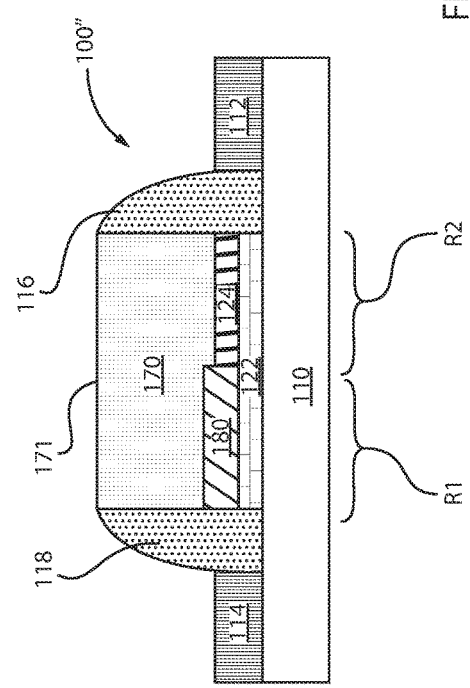

ature pages.# FABRICATING FIN-BASED SPLIT-GATE HIGH-DRAIN-VOLTAGE TRANSISTOR BY WORK FUNCTION TUNING

BACKGROUND

Technical Field

The present invention relates generally to semiconductor devices, and more specifically, to fabricating a fin-based split-gate high-drain-voltage transistor by work function tuning.

Description of the Related Art

There is great difficulty in maintaining performance improvements in devices of deep submicron generations. Thus, methods for improving performance without scaling down dimensions have become of interest. There is a promising avenue toward higher gate capacitance without having to make the gate dielectric thinner. This approach involves the use of high-k materials. The dielectric constant of such materials is higher than that of silicon dioxide ($SiO_2$). A high-k material can physically be thicker than an oxide and still have a lower equivalent oxide thickness (EOT) value.

High performance small field effect transistor (FET) devices are in need of precise threshold voltage control. As operating voltage decreases, threshold voltages also have to decrease, and threshold variation becomes less tolerable. Every new element, such as a different gate dielectric, or a different gate material, influences the threshold voltage. Techniques exist to tune device thresholds through the modification of the gate work function.

SUMMARY

In accordance with an embodiment, a method is provided for creating an asymmetrical split-gate structure. The method includes forming a first device over a semiconductor substrate, the first device having first source/drain regions formed adjacent a first set of spacers, forming a second device over the semiconductor substrate, the second device having second source/drain regions formed adjacent a second set of spacers, and forming a first gate stack between the first set of spacers of the first device and a second gate stack between the second set of spacers of the second device. The method further includes depositing a hard mask over the first and second gate stacks, etching a first section of the first gate stack to create a first gap region and a second section of the second gate stack to create a second gap region, and forming a third gate stack within the first gap region of the first gate stack and within the second gap region of the second gate stack such that dual gate stacks are defined for each of the first and second devices. The method further includes annealing the dual gate stack of the first and second devices to form a first and second replacement metal gate stack, respectively.

In accordance with another embodiment, a semiconductor device is provided for creating an asymmetrical split-gate structure. The semiconductor device includes a first device formed over a semiconductor substrate, the first device having first source/drain regions formed adjacent a first set of spacers, a second device formed over the semiconductor substrate, the second device having second source/drain regions formed adjacent a second set of spacers, a first gate stack formed between the first set of spacers of the first device, a second gate stack formed between the second set of spacers of the second device, a hard mask deposited over the first and second gate stacks, wherein a first section of the first gate stack is etched to create a first gap region and a second section of the second gate stack is etched to create a second gap region, and a third gate stack formed within the first gap region of the first gate stack and within the second gap region of the second gate stack such that dual gate stacks are defined for each of the first and second devices. The dual gate stacks of the first and second devices are annealed to form a first and second replacement metal gate stack, respectively.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including a first device including a first gate stack and a second device including a second gate stack, in accordance with an embodiment of the present invention;

FIG. 2 is a cross-sectional view of the semiconductor structure of FIG. 1 where a hard mask is deposited over the first and second gate stacks and a section of the first gate stack, as well as a section of the second gate stack are removed, in accordance with an embodiment of the present invention;

FIG. 6 is a cross-sectional view of the semiconductor structure of FIG. 5 where amorphous silicon is deposited, in accordance with an embodiment of the present invention;

FIG. 7 is a cross-sectional view of the semiconductor structure of FIG. 6 where the dual stacks of each of the first and second devices is annealed, in accordance with an embodiment of the present invention;

Throughout the drawings, same or similar reference numerals represent the same or similar elements.

DETAILED DESCRIPTION

Figure 3:
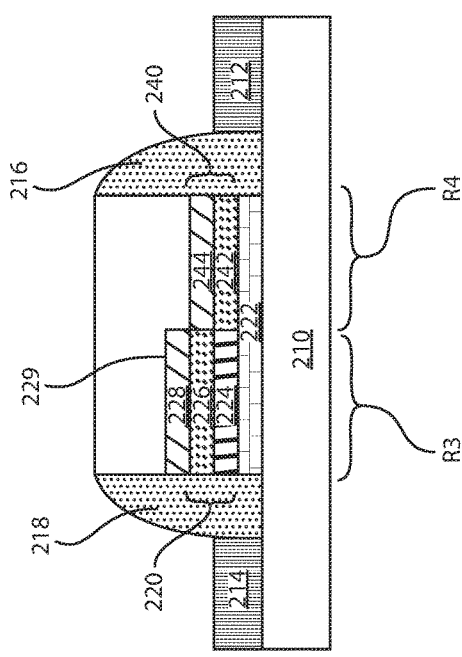
FIG. 3 is a cross-sectional view of the semiconductor structure of FIG. 2 where a third gate stack is formed adjacent the first gate stack of the first device and adjacent the second gate stack of the second device to define dual or split gate stacks within each of the first and second devices, in accordance with an embodiment of the present invention.
Figure 3:
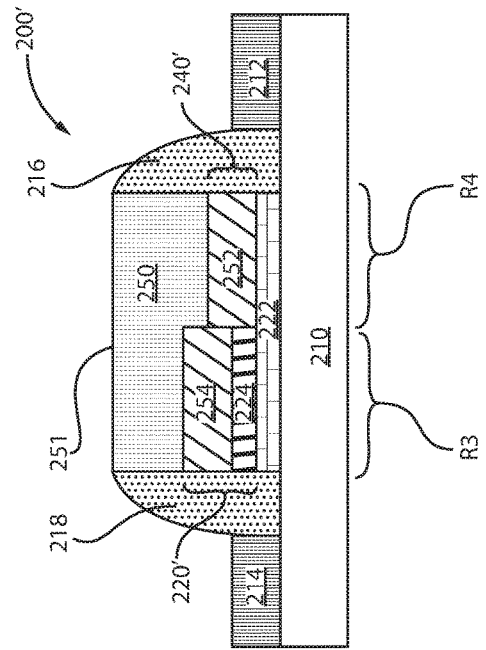

Embodiments in accordance with the present invention provide methods and devices for achieving multiple work functions on a single structure. Multiple work function gate stacks can be useful to achieve multiple threshold voltages on fully depleted channel architectures. A variety of different work-function setting metal stacks can be used. In one example, two devices are formed over a semiconductor substrate. The first device can be, e.g., an n-type field effect transistor (FET) and the second device can be, e.g., a p-type field effect transistor (FET). The first device includes a first gate structure and the second device includes a second gate structure. The first gate structure is designed to have a different work function than the second gate structure. The first gate structure of the first device can be a dual gate structure. Similarly, the second gate structure of the second device can be a dual gate structure. This can also be referred to as a split-gate structure. Thus, the nFET and the pFET can each include a split-gate structure. Moreover, these gate structures can be referred to as asymmetric split gate structures. The gate structures are split in the middle, as opposed to having front and back gate structures. Stated differently, the gate structure is split along the channel region. This results in a split work function along the channel too, which results in forming split gate devices by using work function metal (WFM) tuning.

Embodiments in accordance with the present invention provide methods and devices for tuning a single transistor in 14 nm FinFET technology, and even smaller 10 nm FinFET technology. In one example embodiment, high-drain voltage applications are targeted for gate-last processes. In integrated circuits, there are metal oxide semiconductor field effect transistors (MOSFETs) that require a high voltage to be applied on a drain side. These are referred to as high-drain metal oxide semiconductor (HD-MOS) devices. The exemplary embodiments of the present invention enable high-drain-voltage FETs for power electronics applications. The high-drain voltage FETs use work function materials in the channel region to enable or achieve high-drain voltage.

Examples of semiconductor materials that can be used in forming such multi-Vt structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

A dielectric is a non-conducting material or substance. (A dielectric is an electrical insulator.) Some dielectrics commonly used in semiconductor technology are $SiO_2$ ("oxide") and $Si_3N_4$ ("nitride"). The insulating quality of a dielectric can be characterized by "k," the dielectric constant. Generally, the higher the "k," the better the insulating quality of the dielectric. Oxide, for example, has a k of approximately 3.9. A class of materials, referred to as "high-k" (or "high-K") dielectrics, have a dielectric constant higher than that of oxide (k>3.9).

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this invention contact and via refer to the completed structure.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

ALD is a gas phase chemical process used to create extremely thin coatings. The majority of ALD reactions use two chemicals called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as 0.1 angstroms per monolayer. ALD has unique advantages over other thin film deposition techniques, as ALD grown films are conformal, pin-hole free, and chemically bonded to the substrate. With ALD it is possible to deposit coatings perfectly uniform in thickness inside deep trenches, porous media and around particles. The film thickness range is usually about 1 to about 500 nm. ALD can be used to deposit several types of thin films, including various ceramics, from conductors to insulators.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through conventional measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including a first device including a first gate stack and a second device including a second gate stack, in accordance with an embodiment of the present invention.

In various example embodiments, a first device 100 and a second device 200 are formed. The first device can be, e.g., an nFET device 100. The second device can be, e.g., a pFET device 200.

The nFET device 100 includes a substrate 110. Source/drain regions 112, 114 are formed over the substrate 110. A gate stack 120 is formed between spacers 116, 118. The gate stack 120 can be formed over a high-k dielectric layer 122. The gate stack 120 can include, e.g., three layers. A first layer 124, a second layer 126, and a third layer 128. The first layer 124 can be, e.g., a titanium nitride (TiN) layer. The second layer 126 can be, e.g., an AO layer. The AO layer can be, e.g., a lanthanum oxide ($La_2O_3$) layer. The third layer 128 can be, e.g., a TiN layer. The spacers 116, 118 can extend above a top surface of the gate stack 120. Stated differently, the third layer 128 of the gate stack 120 can extend a distance "A" from a tip of the spacers 116, 118. The gate stack 120 extends along the high-k dielectric material 122 such that the gate stack 120 contacts both spacers 116, 118.

Similarly, the pFET device 200 includes a substrate 210. Source/drain regions 212, 214 are formed over the substrate 210. A gate stack 220 is formed between spacers 216, 218. The gate stack 220 can be formed over a high-k dielectric layer 222. The gate stack 220 can include, e.g., three layers. A first layer 224, a second layer 226, and a third layer 228. The first layer 224 can be, e.g., a titanium nitride (TiN) layer. The second layer 226 can be, e.g., an AO layer. The AO layer can be, e.g., a lanthanum oxide ($La_2O_3$) layer. The third layer 228 can be, e.g., a TiN layer. The spacers 216, 218 can extend above a top surface of the gate stack 220. Stated differently, the third layer 228 of the gate stack 220 can extend a distance "B" from a tip of the spacers 216, 218. The gate stack 220 extends along the high-k dielectric material 222 such that the gate stack 220 contacts both spacers 216, 218.

The spacers 116, 118 (or 216, 218) can be, e.g., a nitride film. In an embodiment, the spacers 116, 118 can be an oxide, for example, silicon oxide (SiO), a nitride, for example, a silicon nitride (SiN), or an oxynitride, for example, silicon oxynitride (SiON). In an embodiment, the spacers 116, 118 can be, e.g., SiOCN, SiBCN, or similar film types. The spacers 116, 118 can also be referred to as non-conducting dielectric layers.

In some exemplary embodiments, the spacers 116, 118 can include a material that is resistant to some etching processes such as, for example, HF (hydrogen fluoride) chemical etching or chemical oxide removal etching. For illustrative purposes, the spacers 116, 118 are shown as a single layer of material. Exemplary embodiments of the spacers 116, 118 can include, for example, multiple layers of similar or dissimilar materials that can be disposed in horizontally or vertically arranged layers relative to the substrate 110 by any suitable material deposition process.

In one or more embodiments, the spacers 116, 118 can have a thickness in the range of about 3 nm to about 10 nm, or in the range of about 3 nm to about 5 nm.

In various embodiments, the in-situ doped source/drain 112, 114 (or 212, 214) is advantageously deposited or formed via epitaxial growth. Depending on how the epitaxial growth develops, it can be necessary to anisotropically etch the epitaxial growth, in order to result in a top surface of the source/drain region 112, 114 that is suitable for subsequent processing.

The dopant can be provided to the doped region(s) 112, 114 (e.g., source/drain region(s)) by ion implantation, and source/drains formed by annealing the doped region(s) 112, 114. In various embodiments, the doped regions 112, 114 can be n-doped or p-doped.

In various embodiments, the bottom source can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 112, 114 can include forming an in situ doped epitaxial semiconductor material on the source and drain region portions of the substrates 110, 120. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 112, 114 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 112, 114.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition usually ranges from about 550° C. to about 900° C. Although higher temperature usually results in faster deposition, the faster deposition can result in crystal defects and film cracking.

The epitaxial semiconductor material that provides the source and drain regions 112, 114 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

FIG. 2 is a cross-sectional view of the semiconductor structure of FIG. 1 where a hard mask is deposited over the first and second gate stacks and a section of the first gate stack, as well as a section of the second gate stack are removed, in accordance with an embodiment of the present invention.

In various example embodiments, regarding the structure 100 (nFET), a hard mask 130 is deposited over a portion of the gate stack 120. An RCA clean and etch can then take place. The etch can be, e.g., an RIE etch. After cleaning and etching, a top surface 121 of the high-k dielectric material 122 is exposed and the portion of the gate stack 120 under the hard mask 130 remains. A gap region 125 is created adjacent the gate stack 120. Thus, a gap region 125 is formed within a first region R1. The remaining gate stack 120 is formed in a second region R2.

Similarly, regarding the structure 200 (pFET), a hard mask 230 is deposited over a portion of the gate stack 220. An RCA clean and etch can then take place. The etch can be, e.g., an RIE etch. After cleaning and etching, a top surface 221 of the high-k dielectric material 222 is exposed and the portion of the gate stack 220 under the hard mask 230 remains. A gap region 225 is created adjacent the gate stack 220. Thus, a gap region 225 is formed within a fourth region R4. The remaining gate stack 220 is formed in a third region R3.

The block mask 130 can comprise soft and/or hard mask materials and can be formed using deposition, photolithography and etching. In one embodiment, the block mask 130 is a hard mask composed of a nitride-containing material, such as silicon nitride (SiN). It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate. A patterned photoresist can be produced by applying a blanket photoresist layer to the surface of the dummy gate, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Additionally, an RCA clean can be performed. The first step of the RCA clean that includes ammonium hydroxide and hydrogen peroxide can be referred to as "SC-1" (standard clean #1). SC-1 includes of a mixture of ammonium hydroxide and hydrogen peroxide and deionized water. A typical concentration ratio for the mix is 1:1:5 $NH_4OH$:$H_2O_2$:$H_2O$, although ratios as low as 0.05:1:5 are suitable for cleaning the substrate 5. SC-1 typically operates in a temperature ranging from 50° C. to 70° C.

The second step of the RCA clean that includes the aqueous mixture of hydrochloric acid and an oxidizing agent that can be referred to as "SC-2" (standard clean #2). SC-2 includes a mixture of hydrochloric acid, hydrogen peroxide, and deionized water. A typical concentration ratio for the mix is 1:1:5 $HCl$:$H_2O_2$:$H_2O$. SC-2 is typically operated in the temperature range of 50-70° C.

In another embodiment, the chemical cleaning process is provided by a hydrofluoric acid last process. In this embodiment, oxide material, such as silicon oxide or silicon oxynitride, is removed by the application of a solution of hydrofluoric acid. The hydrofluoric acid is usually diluted with deionized water in order to slow down the etch rate of the silicon oxide, thereby ensuring better etch uniformity. In one embodiment, the dilution ratio ranges from 1:1 HF:H$_2$O to 300:1 H$_2$O:HF. In another embodiment, the hydrofluoric acid can be diluted with ammonium fluoride (NH$_4$F).

FIG. 3 is a cross-sectional view of the semiconductor structure of FIG. 2 where a third gate stack is formed adjacent the first gate stack of the first device and adjacent the second gate stack of the second device to define dual or split gate stacks within each of the first and second devices, in accordance with an embodiment of the present invention.

In various example embodiments, regarding the structure 100 (nFET), another gate stack is 140 is deposited adjacent the gate stack 120. The gate stack 140 can include two layers. The first layer 142 can be, e.g., an AO layer and the second layer 144 can be, e.g., a conducting layer 144. The conducting layer 144 can be, e.g., a TiN layer. Subsequently, the hard mask 130 can be removed to expose a top surface 129 of the third layer 128 of the gate stack 120. The gate stack 120 can have a different height than the gate stack 140. The gate stacks 120, 140 can be asymmetrical, as shown below with reference to FIG. 4 below.

Similarly, regarding the structure 200 (pFET), another gate stack is 240 is deposited adjacent the gate stack 220. The gate stack 240 can include two layers. The first layer 242 can be, e.g., an AO layer and the second layer 244 can be, e.g., a conducting layer 244. The conducting layer 244 can be, e.g., a TiN layer. Subsequently, the hard mask 230 can be removed to expose a top surface 229 of the third layer 228 of the gate stack 220. The gate stack 220 can have a different height than the gate stack 240. The gate stacks 220, 240 can be asymmetrical, as shown below with reference to FIG. 4 below.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 4:
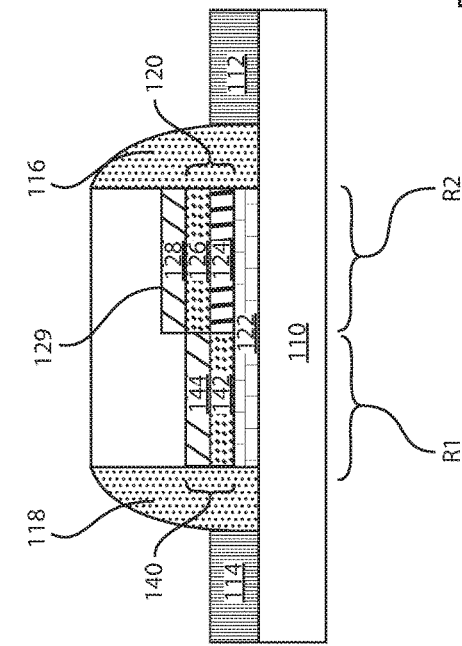
FIG. 4 is a cross-sectional view of the semiconductor structure of FIG. 3 where the dual or split gate stacks within each of the first and second devices is annealed to form replacement metal gates, in accordance with an embodiment of the present invention.
Figure 4:
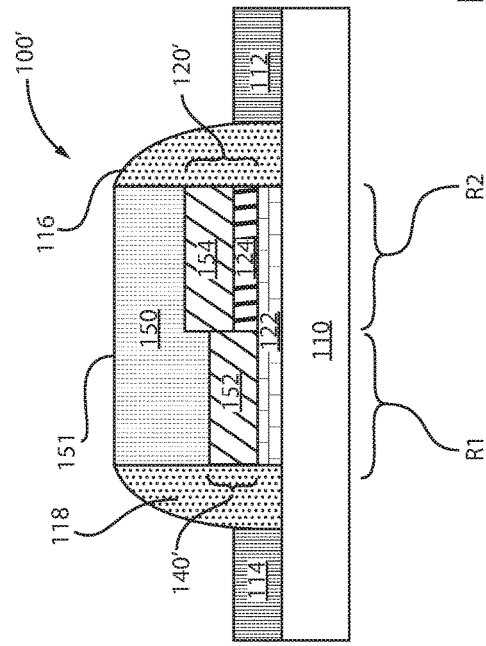

FIG. 4 is a cross-sectional view of the semiconductor structure of FIG. 3 where the dual or split gate stacks within each of the first and second devices is annealed to form replacement metal gates, in accordance with an embodiment of the present invention.

In various example embodiments, regarding the nFET structure, thermal annealing takes place to form a dual gate stack or split-gate structure. The split-gate structure includes a first gate portion 120' and a second gate portion 140'. The first gate portion 120' can be, e.g., two conducting layers 124, 154. The second gate portion 140' can be, e.g., a single conducting layer 152. The conducting layers 124, 152, 154 can be TiN layers. The first gate portion 120' and the second gate portion 140' can be asymmetrical. The first gate portion 120' and the second gate portion 140' can have different heights. The first and second gate portions 120', 140' can be referred to as replacement metal gates. Additionally, an amorphous silicon layer 150 can be deposited over the first and second gate portions 120', 140'. The top surface 151 of the amorphous silicon layer 150 can extend up to a top surface of the spacers 116, 118.

Regarding the pFET structure, thermal annealing takes place to form a dual gate stack or split-gate structure. The split-gate structure includes a first gate portion 220' and a second gate portion 240'. The first gate portion 220' can be, e.g., two conducting layers 224, 254. The second gate portion 240' can be, e.g., a single conducting layer 252. The conducting layers 224, 252, 254 can be TiN layers. The first gate portion 220' and the second gate portion 240' can be asymmetrical. The first gate portion 220' and the second gate portion 240' can have different heights. The first and second gate portions 220', 240' can be referred to as replacement metal gates. Additionally, an amorphous silicon layer 250 can be deposited over the first and second gate portions 220', 240'. The top surface 251 of the amorphous silicon layer 250 can extend up to a top surface of the spacers 216, 218.

Moreover, the work function of the first gate structure of the first device 100' can be different than the work function of the second gate structure of the second device 200'. Therefore, the first device 100' includes a first gate structure and the second device 200' includes a second gate structure. The first gate structure can be designed to have a different work function than the second gate structure. The first gate structure of the first device 100' can be a dual gate structure 120', 140' (in regions R1 and R2). Similarly, the second gate structure of the second device 200' can be a dual gate structure 220', 240' (in regions R3 and R4). This can also be referred to as a split-gate structure (for each device 100', 200'). Thus, the nFET and the pFET devices 100', 200' can each include a split-gate structure. Moreover, these gate structures can be referred to as asymmetric split gate structures. The gate structures are split in the middle, as opposed to having front and back gate structures. Stated differently, the gate structure (of each device 100', 200') is split along the channel region. This results in a split work function along the channel too, which results in forming split gate devices by using work function metal (WFM) tuning.

The "work function" (WF) is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal.

WF is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band; in the case, the minimum energy to remove an electron is about the sum of half the band gap and the electron affinity. An effective work function (eWF) is defined as the WF of metal on the dielectric side of a metal-dielectric interface.

The WF of a semiconductor material can be altered by doping the semiconductor material. For example, undoped polysilicon has a work function of about 4.65 eV, whereas polysilicon doped with boron has a work function of about 5.15 eV. When used as a gate electrode, the WF of a semiconductor or conductor directly affects the threshold voltage of the transistor.

The WF is a key parameter for setting the threshold voltage (Vth) of the complementary metal oxide semiconductor (CMOS) device, whether an n-type field effect transistor (FET) or a p-type FET. In order to obtain a good electrical control of the FET devices, the WF value should be close to the valence band of the semiconductor for a pFET and close to the conduction band of the semiconductor for an nFET, and more particularly, about 5.2 eV and about 4.0 eV, respectively for the pFET and nFET in the case of silicon.

Such WF setting metal layers can include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a WF setting metal layer portion of the metal gate material stack. Alternatively, titanium aluminum nitride, titanium aluminum carbide, tantalum aluminum, tantalum aluminum nitride, tantalum aluminum carbide, hafnium silicon alloy, hafnium nitride, or tantalum carbide can be used in the WF setting metal layer portion in lieu of the titanium aluminum.

Regardless of the specific WF setting metal layers used in either an nFET or a pFET device, the remainder of the metal gate material stack can include a fill metal such as aluminum, titanium-doped aluminum, tungsten or copper to result in the metal gate material stack.

Figure 5:
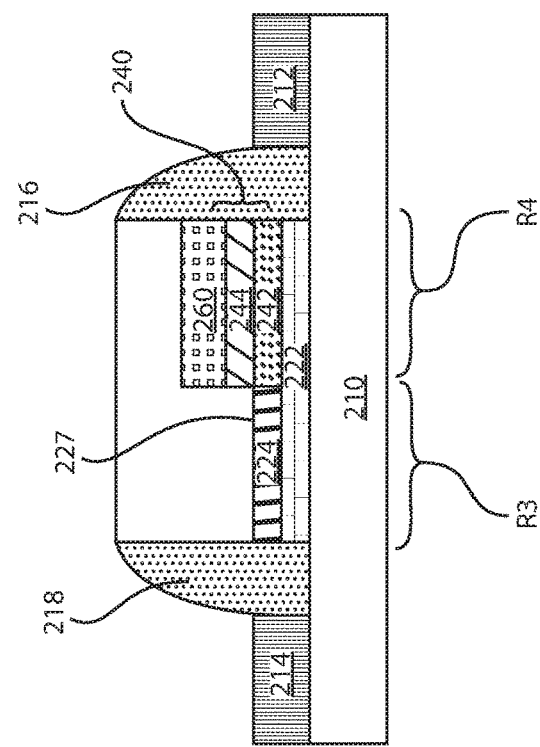
FIG. 5 is a cross-sectional view of the semiconductor structure of FIG. 3 where another masking layer is deposited over the third gate stack, in accordance with another embodiment of the present invention.
Figure 5:
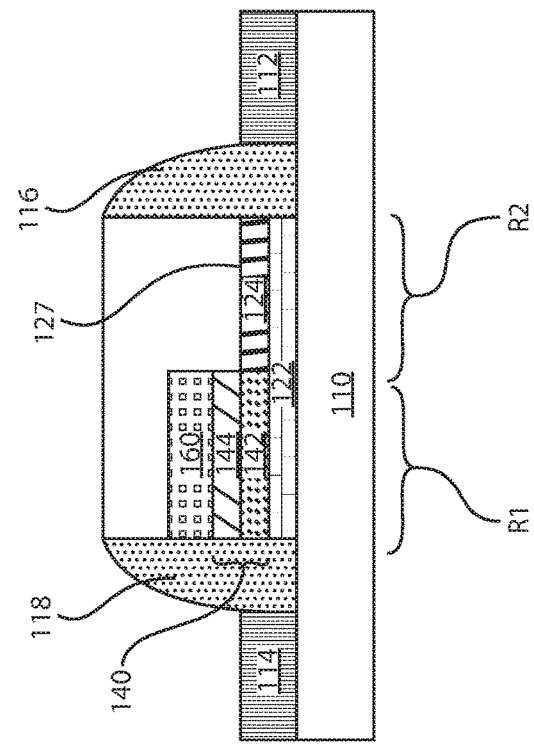

FIG. 5 is a cross-sectional view of the semiconductor structure of FIG. 3 where another masking layer is deposited over the third gate stack, in accordance with another embodiment of the present invention.

In various example embodiments, at FIG. 3, regarding the nFET portion, instead of annealing and depositing an amorphous silicon layer, another block mask 160 can be deposited over the gate stack 140. Cleaning and etching can take place. Etching can be, e.g., by RIE. The etching results in removal of the second layer 126 and the third layer 128 of the gate stack 120. Thus, a top surface 127 of the first layer 124 is exposed. As a result, the first region R1 includes a gate stack 140 and the second region R2 includes a conducting material layer 124.

Similarly, at FIG. 3, regarding the pFET portion, instead of annealing and depositing an amorphous silicon layer, another block mask 260 can be deposited over the gate stack 240. Cleaning and etching can take place. Etching can be, e.g., by RIE. The etching results in removal of the second layer 226 and the third layer 228 of the gate stack 220. Thus, a top surface 227 of the first layer 224 is exposed. As a result, the fourth region R4 includes a gate stack 240 and the third region R3 includes a conducting material layer 224.

FIG. 6 is a cross-sectional view of the semiconductor structure of FIG. 5 where amorphous silicon is deposited, in accordance with an embodiment of the present invention.

In various example embodiments, regarding the nFET portion, thermal annealing takes place to form a dual gate stack or split-gate structure. Additionally, an amorphous silicon layer 170 can be deposited over the first and second gate portions 140, 124. The top surface 171 of the amorphous silicon layer 170 can extend up to a top surface of the spacers 116, 118.

Similarly, regarding the pFET portion, thermal annealing takes place to form a dual gate stack or split-gate structure. Additionally, an amorphous silicon layer 270 can be deposited over the first and second gate portions 240, 224. The top surface 271 of the amorphous silicon layer 270 can extend up to a top surface of the spacers 216, 218.

FIG. 7 is a cross-sectional view of the semiconductor structure of FIG. 6 where the dual stacks of each of the first and second devices is annealed, in accordance with an embodiment of the present invention.

In various example embodiments, regarding the nFET structure, the split-gate structure includes a first gate portion 180 and a second gate portion 124. The first gate portion 180 can be, e.g., a single conducting layer. The second gate portion 124 can also be, e.g., a single conducting layer. The conducting layers 124, 180 can be, e.g., TiN layers. The first gate portion 180 and the second gate portion 124 can be asymmetrical. In other words, the first gate portion 180 and the second gate portion 124 can have different heights. For example, the height of the first gate portion 180 can be greater than the height of the second gate portion 124. The first and second gate portions 180, 124 can be referred to as replacement metal gates. The first and second gate portions 180, 124 form the gate structure of the nFET 100".

Similarly, regarding the pFET structure, the split-gate structure includes a first gate portion 280 and a second gate portion 224. The first gate portion 280 can be, e.g., a single conducting layer. The second gate portion 224 can also be, e.g., a single conducting layer. The conducting layers 224, 280 can be, e.g., TiN layers. The first gate portion 280 and the second gate portion 224 can be asymmetrical. In other words, the first gate portion 280 and the second gate portion 224 can have different heights. For example, the height of the first gate portion 280 can be greater than the height of the second gate portion 224. The first and second gate portions 280, 224 can be referred to as replacement metal gates. The first and second gate portions 280, 224 form the gate structure of the nFET 200".

Figure 8:
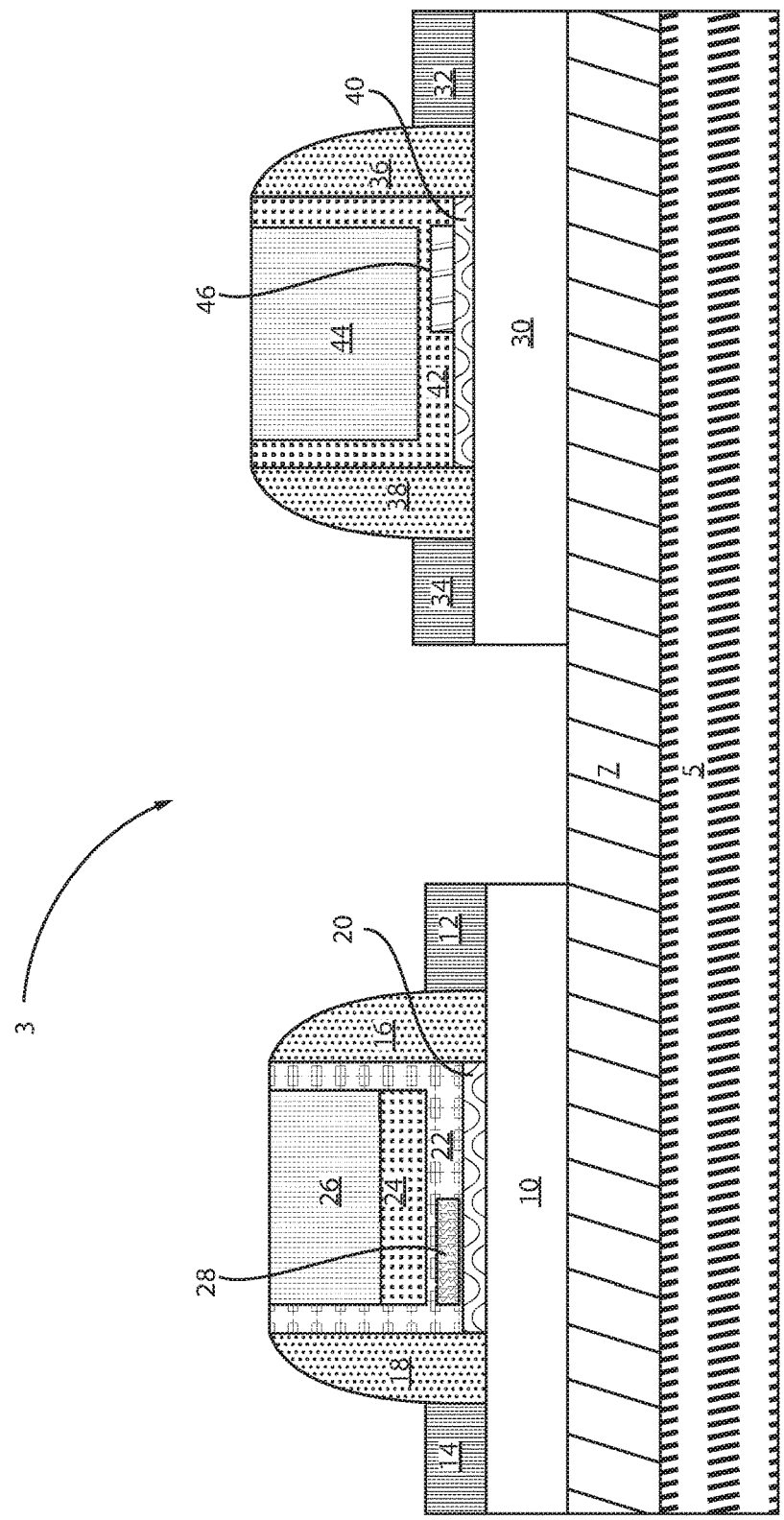
FIG. 8 is a cross-sectional view of a semiconductor structure where an nFET has two different work functions, in accordance with another embodiment of the present invention.

FIG. 8 is a cross-sectional view of a semiconductor structure where an nFET has two different work functions, in accordance with another embodiment of the present invention.

In various example embodiments, a structure 3 includes a buried oxide (BOX) layer 7 over a substrate 5. The BOX layer 7 can have a thickness of about 500 to about 2500 Å (50-250 nm). A first and second device is formed over the BOX layer 7. The first device can be, e.g., an nFET device, whereas the second device can be, e.g., a pFET device.

In various example embodiments, the nFET device (left hand side) includes a substrate 10, source/drain regions 12, 14 formed thereon, as well as spacers 16, 18. A high-k dielectric layer 20 is formed over a portion of the substrate 10 and in between the spacers 16, 18. A first work function metal layer 22 is deposited over the high-k dielectric layer 20 and adjacent an inner surface of the spacers 16, 18 such that the first work function metal layer 22 defines a U-shape. A second work function metal layer 24 is then deposited within the first work function metal layer 22. An amorphous silicon layer 26 can then be formed over the second work function metal layer 24. The amorphous silicon layer 26 can contact both the first and second work function metal layers 22, 24. The amorphous silicon layer 26 can be planarized by, e.g., CMP to be flush with a top surface of the spacers 16, 18. The first work function metal layer 22 can be, e.g., an n-type work function metal layer. The second work function metal layer 24 can be, e.g., a p-type work function metal layer. An AO area 28 can also be formed within the first work function metal layer 22. The AO area 28 can be designed to decrease a threshold voltage (Vt) of the nFET.

In various example embodiments, the pFET device (right hand side) includes a substrate 30, source/drain regions 32, 34 formed thereon, as well as spacers 36, 38. A high-k dielectric layer 40 is formed over a portion of the substrate 30 and in between the spacers 36, 38. A work function metal layer 42 is deposited over the high-k dielectric layer 40 and adjacent an inner surface of the spacers 36, 38 such that the work function metal layer 42 defines a U-shape. An amorphous silicon layer 44 can then be formed over the work function metal layer 42. The amorphous silicon layer 44 can be planarized by, e.g., CMP to be flush with a top surface of the spacers 36, 38. The work function metal layer 42 can be, e.g., a p-type work function metal layer. An AO area 46 can also be formed within the work function metal layer 42. The AO area 46 can be designed to increase a threshold voltage (Vt) of the pFET.

In one or more embodiments, the substrates 5, 10, 30 can be a semiconductor or an insulator with an active surface semiconductor layer. The substrates 5, 10, 30 can be crystalline, semi-crystalline, microcrystalline, or amorphous. The substrates 5, 10, 30 can be essentially (e.g., except for contaminants) a single element (e.g., silicon), primarily (e.g., with doping) of a single element, for example, silicon (Si) or germanium (Ge), or the substrates 5, 10, 30 can include a compound, for example, $Al_2O_3$, $SiO_2$, GaAs, SiC, or SiGe. The substrates 5, 10, 30 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrates 5, 10, 30 can also have other layers forming the substrates 5, 10, 30, including high-k oxides and/or nitrides. In one or more embodiments, the substrates 5, 10, 30 can be a silicon wafer. In an embodiment, the substrates 5, 10, 30 is a single crystal silicon wafer.

Figure 9:
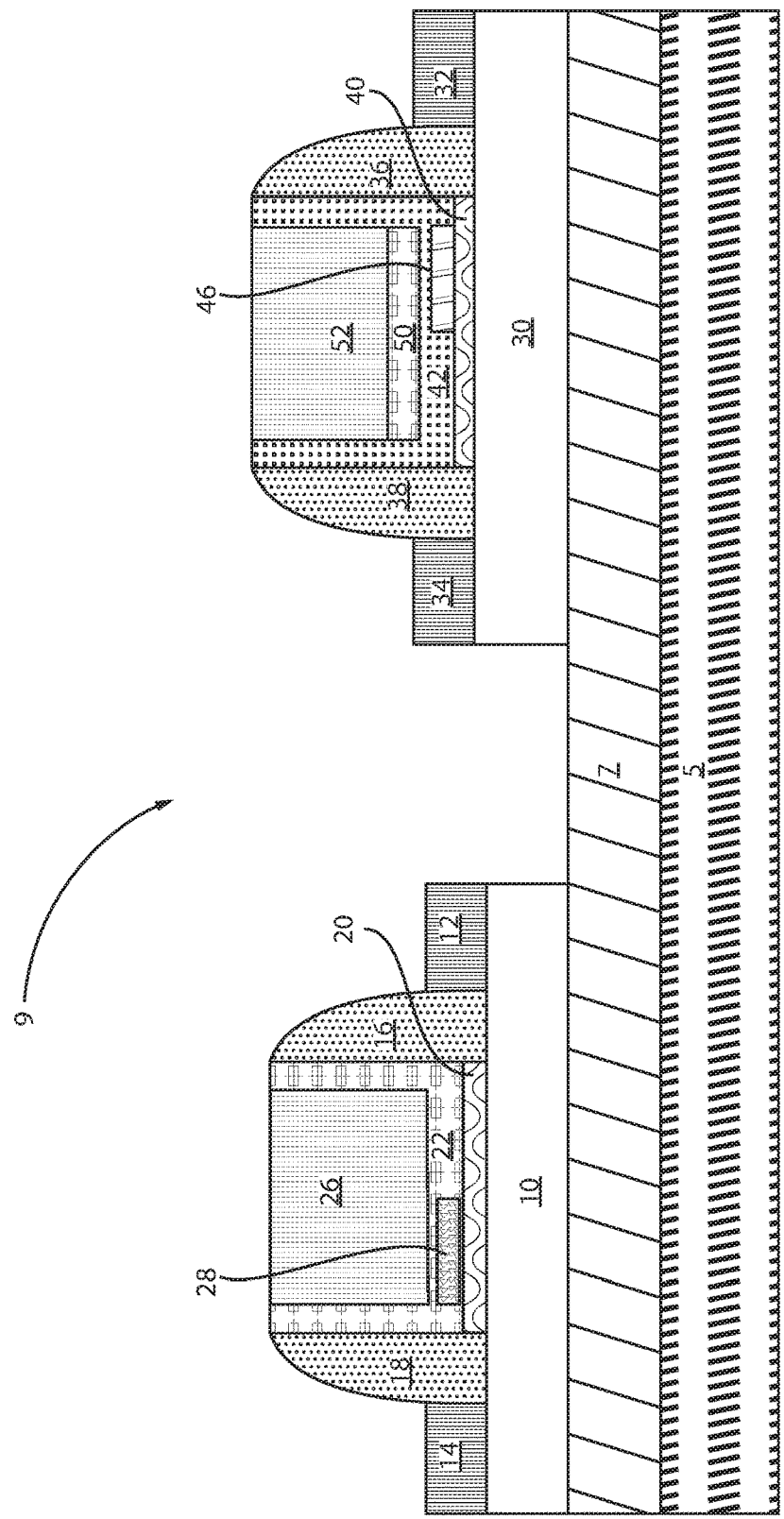
FIG. 9 is a cross-sectional view of a semiconductor structure where a pFET has two different work functions, in accordance with another embodiment of the present invention.

FIG. 9 is a cross-sectional view of a semiconductor structure where a pFET has two different work functions, in accordance with another embodiment of the present invention.

In various example embodiments, a structure 9 includes a buried oxide (BOX) layer 7 over a substrate 5. The BOX layer 7 can have a thickness of about 500 to about 2500 Å (50-250 nm). A first and second device is formed over the BOX layer 7. The first device can be, e.g., an nFET device, whereas the second device can be, e.g., a pFET device.

In various example embodiments, the nFET device (left hand side) includes a substrate 10, source/drain regions 12, 14 formed thereon, as well as spacers 16, 18. A high-k dielectric layer 20 is formed over a portion of the substrate 10 and in between the spacers 16, 18. A work function metal layer 22 is deposited over the high-k dielectric layer 20 and adjacent an inner surface of the spacers 16, 18 such that the work function metal layer 22 defines a U-shape. An amorphous silicon layer 26 can then be formed over the work function metal layer 22. The amorphous silicon layer 26 can be planarized by, e.g., CMP to be flush with a top surface of the spacers 16, 18. The work function metal layer 22 can be, e.g., an n-type work function metal layer. An AO area 28 can also be formed within the work function metal layer 22. The AO area 28 can be designed to decrease a threshold voltage (Vt) of the nFET.

In various example embodiments, the pFET device (right hand side) includes a substrate 30, source/drain regions 32, 34 formed thereon, as well as spacers 36, 38. A high-k dielectric layer 40 is formed over a portion of the substrate 30 and in between the spacers 36, 38. A first work function metal layer 42 is deposited over the high-k dielectric layer 40 and adjacent an inner surface of the spacers 36, 38 such that the first work function metal layer 42 defines a U-shape. A second work function metal layer 50 is deposited within the first work function metal layer 42. An amorphous silicon layer 52 can then be formed over the second work function metal layer 50. The amorphous silicon layer 52 can contact both the first and second work function metal layers 42, 50. The amorphous silicon layer 52 can be planarized by, e.g., CMP to be flush with a top surface of the spacers 36, 38. The first work function metal layer 42 can be, e.g., a p-type work function metal layer. The second work function metal layer 50 can be, e.g., an n-type work function metal layer. An AO area 46 can also be formed within the first work function metal layer 42. The AO area 46 can be designed to increase a threshold voltage (Vt) of the pFET.

Consequently, the structures of FIGS. 4, 7, 8, and 9 allow for the work function of selected transistors to be fine-tuned. This results in a final structure having different work functions. As a result, multiple work functions can be achieved for different devices on the same wafer/chip. Therefore, the gate stack of each device (e.g., FET) can have a different work function to achieve complementary metal oxide semiconductor (CMOS) technology with multiple threshold voltages (Vt) on fully depleted channel architectures in order to take advantage of higher mobility and smaller device variability. The channel potential can be modulated by using different gate work function materials.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element described below could be termed a second element without departing from the scope of the present concept.

Having described preferred embodiments of a method of device fabrication and a semiconductor device thereby fabricated for forming a fin-based split-gate high-drain-voltage transistor by work function tuning (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for creating an asymmetrical split-gate structure, the method comprising:
    forming a first device over a semiconductor substrate, the first device having first source drain regions formed adjacent a first set of spacers;
    forming a second device over the semiconductor substrate, the second device having second source/drain regions formed adjacent a second set of spacers;
    forming a first gate stack between the first set of spacers of the first device and a second gate stack between the second set of spacers of the second device;
    depositing a hard mask over the first and second gate stacks;
    etching a first section of the first gate stack to create a first gap region and a second section of the second gate stack to create a second gap region;
    forming a third gate stack within the first gap region of the first gate stack, the third gate stack having a different number of layers than the first gate stack, and a fourth gate stack within the second gap region of the second gate stack such that dual gate stacks are defined for each of the first and second devices; and
    annealing the dual gate stacks of the first and second devices to form first and second replacement metal gate stacks, respectively.

2. The method of claim 1, wherein a work function of the first replacement metal gate stack is different than a work function of the second replacement metal gate stack.

3. The method of claim 1, wherein the first device is an n-type field effect transistor (FET) and the second device is a p-type FET.

4. The method of claim 1, wherein the first and second gate stacks include a same number and type of material layers.

5. The method of claim 1, wherein the first and second gate stacks each include a first conducting layer, an AO layer, and a second conducting layer.

6. The method of claim 5, wherein the first and second conducting layers are titanium nitride (TiN) and the AO layer is a lanthanum oxide ($La_2O_3$) layer.

7. The method of claim 1, wherein the third gate stack includes an AO layer and a conducting layer.

8. The method of claim 1, wherein the first replacement metal gate stack of the first device and the second replacement metal gate stack of the second device include TiN layers.

9. The method of claim 8, further comprising depositing an amorphous silicon layer over each of the first replacement metal gate stack of the first device and the second replacement metal gate stack of the second device.

10. The method of claim 1, further comprising depositing an amorphous silicon layer before the annealing step.

* * * * *